United States Patent [19]

Williamson

[11] Patent Number: 5,006,789
[45] Date of Patent: Apr. 9, 1991

[54] ELECTRO-OPTIC SIGNAL MEASUREMENT

[75] Inventor: Steven Williamson, Ann Arbor, Mich.

[73] Assignee: The University of Rochester, Rochester, N.Y.

[21] Appl. No.: 491,785

[22] Filed: Mar. 12, 1990

Related U.S. Application Data

[62] Division of Ser. No. 355,514, May 23, 1989, Pat. No. 4,928,058.

[51] Int. Cl.$^5$ .............. G01R 19/00; G01R 31/00; G02F 1/09
[52] U.S. Cl. .................. 324/96; 324/158 P; 324/158 R; 350/356
[58] Field of Search ........... 324/158 R, 158 P, 96, 324/72.5; 350/356, 374, 376, 96.12, 96.14; 252/500, 501.1; 356/368

[56] References Cited

U.S. PATENT DOCUMENTS

| | | | |
|---|---|---|---|
| 4,166,669 | 9/1979 | Leonberger et al. | 350/356 |
| 4,336,982 | 6/1982 | Rector, Jr. | 350/356 |
| 4,372,642 | 2/1983 | Singer et al. | 350/96.12 |
| 4,446,426 | 5/1984 | Mourou et al. | 324/158 MG |
| 4,603,293 | 7/1986 | Mourou et al. | 324/96 |
| 4,618,449 | 7/1987 | Roggero et al. | 252/182.18 |
| 4,618,819 | 10/1986 | Mourou et al. | 324/77 K |
| 4,790,635 | 12/1988 | Apsley | 350/356 |
| 4,836,633 | 6/1989 | Morgan et al. | 350/96.18 |
| 4,851,767 | 7/1989 | Halbout et al. | 324/158 P |
| 4,856,860 | 8/1989 | Silberberg et al. | 350/96.12 |
| 4,857,836 | 8/1989 | Soelkner | 324/96 |
| 4,889,402 | 12/1989 | Reinhart | 350/96.12 |
| 4,908,568 | 3/1990 | Soelkner | 350/356 |

Primary Examiner—Kenneth Wieder
Assistant Examiner—Vinh P. Nguyen
Attorney, Agent, or Firm—Martin Lukacher

[57] ABSTRACT

Electro-optic probes which are adapted to be placed in the fringe field from electrical signals propagating on conductors (which may be conductors of an integrated circuit) and which modulate optical pulses passing therethrough, for example by modulating the polarization of the light in accordance with the Pockels effect, utilize thin bodies of electro-optic material, such as a single crystal of GaAs in a manner to reduce physical damage to the probe and to the circuit and to precisely locate the probe in the field of the signal being measured, such as adjacent to the conductor of interest. The electro-optic material that is used may also be implanted with high energy ions of low Z materials (e.g. hydrogen or oxygen) so as to create charge trapping sites and to reduce the photo conductivity of the semiconductive electro-optic material sufficiently that the dielectric relaxation time (where photo current through the material reduces by) is less than the duration of the optical pulses without eliminating the electro-optic (e.g. Pockels) effect. Charge carriers are trapped and cannot screen the electric field lines due to the electrical signal being measured which extend between the charge trapping sites where sufficient undamaged electro-optic material remains and enables the field and therefore the signal corresponding thereto to be measured.

7 Claims, 2 Drawing Sheets

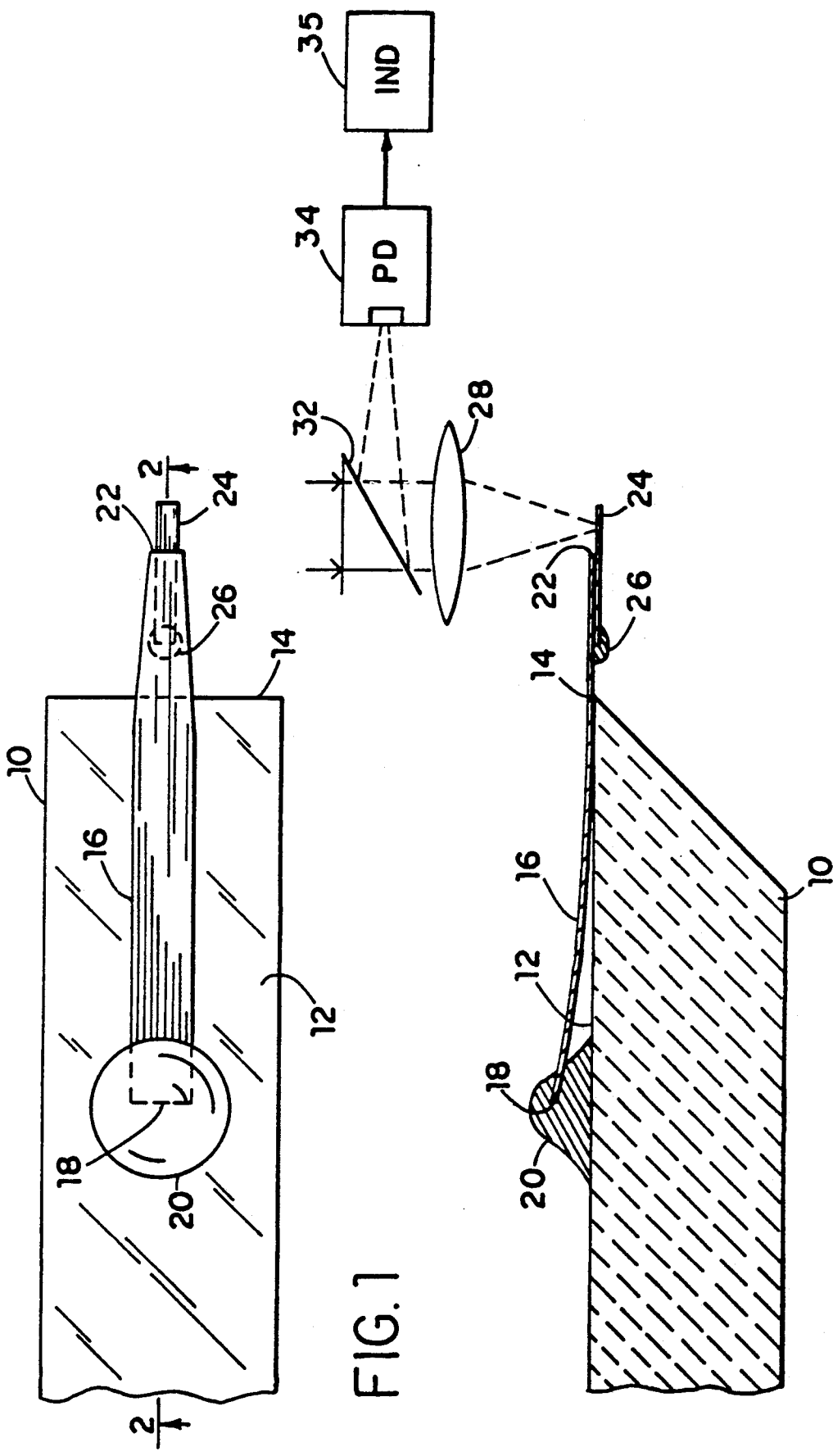

ELECTRO-OPTIC SIGNAL MEASUREMENT

This is a division of application Ser. No. 355,514, filed 5/23/89 now U.S. Pat. No. 4,928,058 issued May 22, 1990.

DESCRIPTION

The present invention relates to electro-optic signal measurement and particularly to probes for making noncontact electro-optical measurements of electrical signals on conductors (by which term is also meant electrodes, lines and other elements) which carry such signals.

The invention is especially suitable for the measurement of electrical signals from submicron devices and structures such as integrated circuits wherein the probe is located in the fringe field from the conductors on the circuits and signal measurements of picosecond or even subpicosecond resolution are desired.

Electro-optic measurements of electro-signals have been made using electro-optic (E-O) elements, such as crystals, the index of refraction of which changes in accordance with the strength of the electrical field being measured. A sampling laser beam of short, picosecond range, pulses is focused on the crystal in the region of the fringing electric (E) field. By electro-optic sampling, the signal can be extracted and displayed with picosecond and even subpicosecond resolution. The spatial resolution is determined by the size of the beam cross section (laser spot) in the electro-optic element. Reference may be had to the following patents as well as to the articles referenced therein for further information with respect to the aforementioned electro-optic measurement approach: Mourou and Valdmanis, U.S. Pat. No. 4,446,426, May, 1984; Mourou and Valdmanis, U.S. Pat. No. 4,618,819, Oct., 1986 and Mourou and Mayer, U.S. Pat. No. 4,603,293, July, 1986. Another patent issued in July 1987 as U.S. Pat. No. 4,618,449 also describes the techniques and systems of the aforementioned Mourou et al. patents. Improved electro-optic probes for electro-optic sampling are also described in U.S. patent application Ser. No. 218,178 filed July 13, 1988 in the name of Steven L. Williamson, (now U.S. Pat. No. 4,873,485) the inventor hereof.

Electro-optic probes, particularly the electro-optic crystals thereof, are very small and very fragile. They are therefore subject to damage. Also in order for performing high spatial resolution signal measurements they must be precisely positioned adjacent the conductor of the device under test so that the region of the crystal which the optical sampling beam traverses is in the fringe field of the electrical signal on the conductor of interest.

Another problem in semiconductor electro-optic probes is that photo conductivity is induced in the electro-optic material of the probe due to the sampling beam thereby causing charge carriers to flow which screen the fringe fields from the material thereby appreciably reducing the modulation of the optical signal in response to the electric field being probed.

It is the principal object of the present invention to provide an improved electro-optic probe having an electro-optic element that is mounted so as to provide a rigid support capable of being precisely positioned and which is protected from physical damage when it contacts the device on the test or even other objects, such as when dropped on a hard surface.

It is another object of the present invention to provide an approved electro-optic probe which enables the position of the probe with respect to a conductor of the device under test to be determined by monitoring the amplitude of the optical beam which traverses the probe.

It is a further object of the present invention to provide an improved electro-optic probe in which the adverse affects of photo-conductivity and charge carriers produced by the sampling optical beam is reduced.

Briefly described, an electro-optic probe in accordance with the invention has an electric-optic element (e.g., a crystal) which is supported by a flexural cantilever at the free end thereof. The cantilever is provided a strip of flexural material, such a metal foil of three to five microns thickness, which is tension loaded so as to provide a rigid support. Contact with the element, causes the cantilever to deflect and thereby absorb impacts and other mechanical forces which could damage the electro-optic material (the crystal). Also the optical sampling beam is focused on the probe in the undeflected position, for example with a high power objective lens with a shallow depth of field. The beam traverses the crystal and may be reflected therefrom and relayed on a photo detector. Since the beam is defocused when the probe position is changed, the illumination of the photo detector and the signal therefrom indicates when the probe has contacted the device under test. The exact moment the probe contacts the device is indicated by the change of signal from the photo detector. The device under test can then be withdrawn slightly and the increase in signal amplitude indicates that the probe lifted off the device under test, thereby enabling the probe to be precisely located with high spatial resolution.

An electro-optic, electrical field probe in accordance with the invention also utilizes a body of electro-optic material. This may be a material which changes polarization of light passing through in accordance with the Pockels effect and is a semiconductor. The material has ions of an element with a lower atomic number (Z), than the atomic number of the elements constituting the electro-optic material implanted therein in sufficient quantity to reduce the conductivity thereof. Then charge carriers are not created during a sampling optical pulse period in sufficient amount to shield the electric field being probed. A sufficient amount of ion implantation may be such that reduces the dielectric relaxation time of the electro-optic material by several orders of magnitude less than the duration of each sampling pulse.

The foregoing and other objects, features and advantages of the invention as well as presently preferred embodiments thereof and the best modes now known for practicing the invention will become apparent from a reading of the following description in connection with the accompanying drawings wherein FIG. 1 is a plan view showing a portion of an electro-optic probe having a cantilever support in accordance with the invention;

FIG. 2 is a sectional view along the line 2—2 shown in FIG. 1, and in addition showing, schematically, optics for detecting the position of the probe;

Figure 3:
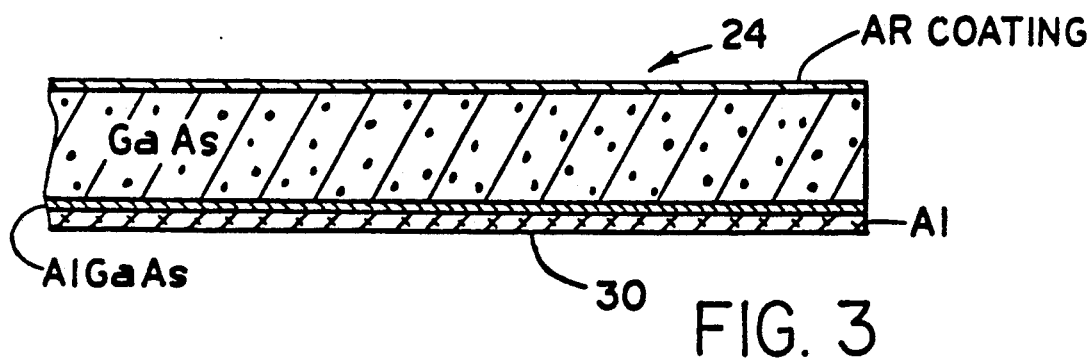
FIG. 3 is an enlarged diagrammatic view illustrating the electro-optic crystal used in the probe shown in FIGS. 1 and 2.

Referring to the drawings and, especially to FIGS. 1 and 2, there is shown a microscope slide or cover slip 10 which is made of glass and has an upper surface 12 and an edge 14. A strip 16 of flexural material is disposed on the surface 12. The thickness of the strip is exaggerated in the drawing. In practice it is a few microns (e.g. from 3 to 5 microns) thick and is made from a foil of metal, suitably aluminum. The foil strip is tension loaded by deflecting a rear end 18 thereof above the surface 12 and while deflected holding it in the deflected position by a drop 20 of the epoxy cement. The strip therefore is a tension loaded leaf spring.

The strip 16 may be 3 to 5 five millimeters long and extends to a free end 22, which is the end of the cantilever. The end 22 may be approximately 1 millimeter from the edge 14. The strip may be tapered in the forward region 24 thereof as shown in FIG. 1.

Attached to the cantilever end is the electro-optic element 24. The attachment of the element 24 is by way of a drop 26 of conductive material which may be silver paint which is of the type used to make contacts to electrodes. This material is known commercially by the name "Silverprint."

Figure 4:
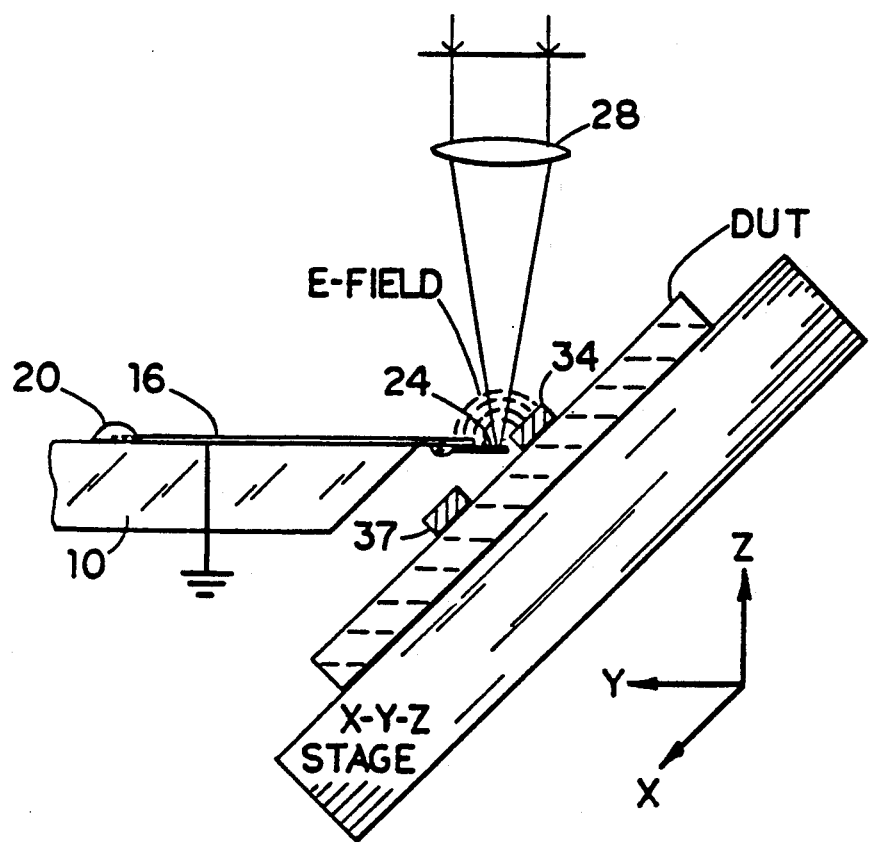
FIG. 4 is a diagrammatic view showing the probe and the electro-optic sampling beam in position for measuring the electric signal on a conductor of a device under test (DUT).

The optical sampling beam is focused by an objective lens 28 so that it has a tight focus on the electro-optic element 24, when the cantilever is in its undeflected state as shown in FIGS. 2 and 4. The beam is then reflected from a reflective metalic layer 30 (see FIG. 3) and through a partially transmitting mirror 32, and is tightly focused on the aperture of a photo detector 34. The photo detector may be a PIN diode with suitable amplification circuits. This diode may be independent of the system which detects the optical pulses which are modulated by fringe fields due to the signal from a conductor of the device under test (DUT). That system may be of the type shown in the above referenced Mourou et al. patents. The photo detector circuit includes filters or integrators so that the optical sampling signal which is in the form of pulses is smoothed. The signal amplitude depends on the illumination of the photo detector. When the electro-optic element 24 moves the focus is blurred, and less light reaches the photo detector. The output of the photo detector as seen on an indicator 25, such as a meter, indicates that it is in the undeflected position.

When it is desired to sample a fringe field, such as the E-field from a conductor 34 of a DUT, as shown in FIG. 4, the position of the probe may be accurately determined. For example, the DUT may be mounted on an X-Y-Z stage which moves in an upward direction, a direction left and right and a direction in and out of the paper as shown by the arrows labeled x, y and z. The stage is moved until deflection of the cantilever occurs. Then the beam, as received by the photo detector, becomes out of focus and the signal as measured on the indicator 35 reduces in amplitude. By backing the stage away slightly, the cantilever "lifts off" from the surface. The movement may be, for example, even less than a micrometer. Then the beam comes back into focus on the photo detector and the signal amplitude increases. Then the probe is just out of contact with the DUT and in the fringe field.

In addition, if the probe impacts a surface, for example if it is dropped on a hard surface, the leaf spring absorbs the shock to the probe instead of breaking, thereby reducing the possibility of physical damage thereto.

In fabricating the probe, an element in the form of a single crystal of electro-optic material, such as gallium arsenide (GaAs), is fabricated which may be approximately 1 millimeter long a few tenths of a millimeter wide and 1 micron in thickness. The element may be made starting with a substrate for example of undoped or semi-insulating GaAs. Then a stop layer, much less than a micron in thickness, of AlGaAs may be epitaxially grown. The GaAs probe layer is then grown to a thickness of one micron (micrometer) to provide the single cyrstal of electro-optic GaAs (Pockel effect responsive) material.

This GaAs layer is desirably ion implanted with high energy ions of low atomic number than the atomic number of the electro-optic material (in this case GaAs). Suitably high energy (100 to 500 Kev) ions of oxygen or hydrogen from an ion implanter may be used. This provides a few microns of penetration depth resulting in the creation of homogeneously distributed deep lying charge traps through the 1 micron thick probe crystal. The implantation is continued until sufficient traps are created to reduce the photo conductivity of the electro-optic material. Suitably the density of these traps is $10^{16}$ to $10^{18}$ per cubic centimeter.

Since there are $10^{23}$ atoms per cubic centimeter in the GaAs crystal, the damaged sites account for less than 1 part in $10^5$ at most. However, the sites are sufficient in number to reduce the conductivity of the probe say from approximately $10^5$ ohm-centimeter (cm) to greater than $10^{16}$ ohm-cm. As a result, the dielectric relaxation time is increased by several orders of magnitude (where the field resulting from photo conductivity reduces to approximately 80% to field in the absence of light and photo conductivity by the reciprocal of the base of Napierian logarithms (1/e)). In other words, the migration of charge carriers of any significance is prevented during the optical sampling pulse, which may be of the order of picoseconds in duration. Therefore, the possibility of neutralizing the electric field within the probe material is essentially eliminated. When the optical-pulse terminates the charge carriers recombine (electrons with holes). Accordingly, the photo conductivity of the electro-optic element 24 does not interfere with electro-optic sampling and the measurement of the signal on the conductor 34 of the DUT.

Returning to the fabrication of the element 24, after the ion implanted GaAs single crystal has been fabricated, the substrate is ground away so that only a small layer thereof remains on the stop layer. Then the remaining GaAs substrate is chemically etched. The etching stops when the etchant reaches the stop layer. A layer of metallic reflective material such as aluminum is then coated, as by sputtering, on the lower side of the crystal. Finally, an anti-reflection (AR) coating such as magnesium fluoride is sputtered on the upper surface of the crystal.

The crystal may now be diced and a segment approximately 1 millimeter long by a few tenths millimeter wide is selected. This segment is, of course, approximately 1 micron thick. In order to adhere and attach the segment to the end of the cantilever, the end is coated with tacky material as by spraying the lower surface with rubber cement. The appropriate size sliver is then attached. The silver print dot 26 is applied and holds the sliver in place. A conductive connection is made from the reflective conductive coating of the element 24 through the silver dot 26 to the conductive strip 16. The strip is connected to ground (or another reference potential). Accordingly, the conductive reflective layer on the underside of the element provides a shield against unwanted fields, safe from a conductor 37 on the DUT (see FIG. 4).

From the foregoing description it will be apparent that there has been provided improved electro-optic signal measurement apparatus and particularly improved electro-optic probes especially suitable for use in a electro-optic sampling signal measurement system. Variations and modifications of the herein described systems and probes, within the scope of the invention, will undoubtedly suggest themselves to those skilled in the art. Accordingly the foregoing description should be taken as a illustrative and not in a limiting sense.

I claim:

1. An electro-optic electrical field probe for measuring an electrical signal which produces a field comprising a body of electro-optic material which changes polarization of light passing therethrough in accordance with the Pockels effect and which comprises a body of semi-conductor electro-optic material having ions of at least one element with a lower atomic number Z, then the atomic number of the elements of said electro-optic material implanted therein to reduce the photoconductivity thereof, and means for disposing said body in the vicinity of said field.

2. The invention as set forth in claim 1 wherein said semi-conductor is a single crystal and said ions which are implanted provide defect sites distributed therein with a density of from about $10^{16}$ to $10^{19}$ per cubic centimeter.

3. The invention as set forth in claim 2 wherein said light is in a form of a train of pulses having a certain duration and said ions are implanted with a density sufficient to increase the dielectric relaxation time of said electro-optic material to be a plurality of orders of magnitude less than said certain duration.

4. The invention as set forth in claim 1 wherein said low Z ions are selected from the group consisting of oxygen and hydrogen ions.

5. The invention as set forth in claim 1 wherein said material is GaAs.

6. The invention as set forth in claim 1 wherein said body has a coating of reflective conductive material on one side thereof.

7. The invention as set forth in claim 6 wherein said body has a coating of AR material on the side through which said light passes.

* * * * *